(12) United States Patent
Chai

(10) Patent No.: US 12,308,858 B2
(45) Date of Patent: May 20, 2025

(54) METHOD, APPARATUS, AND DEVICE FOR DECODING ERROR CORRECTION CODE, AND STORAGE MEDIUM

(71) Applicant: Tongxin Microelectronics Co., Ltd., Beijing (CN)

(72) Inventor: Sen Chai, Beijing (CN)

(73) Assignee: Tongxin Microelectronics Co., Ltd., Beijing (CN)

( * ) Notice: Subject to any disclaimer, the term of this patent is extended or adjusted under 35 U.S.C. 154(b) by 0 days.

(21) Appl. No.: 18/344,566

(22) Filed: Jun. 29, 2023

(65) Prior Publication Data

US 2024/0223220 A1 Jul. 4, 2024

(30) Foreign Application Priority Data

Dec. 30, 2022 (CN) .......................... 202211741382.4

(51) Int. Cl.
*H03M 13/00* (2006.01)
(52) U.S. Cl.
CPC .............................. *H03M 13/6516* (2013.01)
(58) Field of Classification Search
CPC .................................................. H03M 13/6516
See application file for complete search history.

(56) References Cited

U.S. PATENT DOCUMENTS

| | | | | |
|---|---|---|---|---|
| 5,343,481 A | * | 8/1994 | Kraft ..................... | H03M 13/00 714/782 |
| 2010/0115383 A1 | | 5/2010 | Toda | |
| 2015/0155885 A1 | * | 6/2015 | Ikegaya ............ | H03M 13/1545 714/785 |
| 2018/0138926 A1 | * | 5/2018 | Jiang ................... | H03M 13/617 |

OTHER PUBLICATIONS

Extended European Search Report regarding Application No. 23182901.1, dated Jun. 26, 2024.
Injae Too et al, "A Search-less DEC BCH Decoder for Low-Complexity Fault-Tolerant Systems", 2014 IEEE Workshop on Signal Processing Systems (SIPS), IEEE, Oct. 20, 2014 (Oct. 20, 2014), pp. 1-6, XP032709407, DOI: 10.1109/SIPS.2014.6986060 [retrieved on Dec. 15, 2014].
Paul J. Crepeau, "Classification of Error Locator Polynomials for Double Error Correcting BCH Codes", IEEE Transactions on Communications, IEEE Service Center, Piscataway, NJ. USA, vol. 46, No. 8, Aug. 1, 1998 (Aug. 1, 1998), XP011009222, ISSN: 0090-6778.

* cited by examiner

*Primary Examiner* — Guerrier Merant
(74) *Attorney, Agent, or Firm* — Harness, Dickey & Pierce, P.L.C.

(57) ABSTRACT

A method, an apparatus and a device for decoding an error correction code, and a medium are provided. The method includes: acquiring a Galois field equation corresponding to the error correction code, where a total length of the error correction code is a predetermined number of digits; determining a target relational expression corresponding to a plurality of error locations after decoding the error correction code based on the Galois field equation, where the target relational expression is derived based on the Vieta's formulas; determining a first traversal range based on the target relational expression and the predetermined number of digits; determining a first error location from values included in the first traversal range; and determining a second error location based on the target relational expression and the first error location.

10 Claims, 3 Drawing Sheets

METHOD, APPARATUS, AND DEVICE FOR DECODING ERROR CORRECTION CODE, AND STORAGE MEDIUM

CROSS-REFERENCE TO RELATED APPLICATIONS

This application claims the priority to Chinese Patent Application No. 202211741382.4, titled "METHOD, APPARATUS, AND DEVICE FOR DECODING ERROR CORRECTION CODE, AND STORAGE MEDIUM", filed on Dec. 30, 2022 with the Chinese Patent Office, which is incorporated herein by reference in its entirety.

FIELD

The present disclosure relates to the technical field of computers, and in particular to a method, an apparatus and a device for decoding an error correction code, and a storage medium.

BACKGROUND

A BCH code is a linear block code in a finite field (Galois field), which can be used to correct multiple random errors and is commonly used for error-correcting encoding in the fields of communication and storage. BCH codes are block codes obtained by dividing a to-be-sent information sequence into message groups having a fixed number of digits, and converting each of the message groups into a binary digital group. The process of converting a message group into a code word is referred to as encoding, and an inverse process of which is referred to as decoding.

For example, a BCH error correction code with an error-correcting capability of 2 is mainly used for error correction in a scenario of flash storage, that is, the error correction code is decoded to obtain information of two error locations in the flash storage. The critical step in the decoding is the calculation of a root of a quadratic equation with one variable in the Galois field corresponding to the BCH error correction code. In the conventional technology, the root is calculated by: traversing all values in the Galois field, substituting each of the values into the quadratic equation with one variable and determining whether the equation is equal to zero, which results in a large calculation amount for solving the root and thus a complex decoding process.

SUMMARY

In view of the above, a method, an apparatus and a device for decoding an error correction code, and a medium are provided according to the present disclosure, to reduce the calculation amount and the complexity in the decoding process.

In a first aspect, a method for decoding an error correction code is provided according to the present disclosure, which includes:
acquiring a Galois field equation corresponding to the error correction code, where a total length of the error correction code is a predetermined number of digits;
determining a target relational expression corresponding to a plurality of error locations after decoding the error correction code based on the Galois field equation, wherein the target relational expression is derived based on Vieta's formulas;
determining a first traversal range based on the target relational expression and the predetermined number of digits;
determining a first error location from values included in the first traversal range; and
determining a second error location based on the target relational expression and the first error location.

In an embodiment, a process of deriving the target relational expression from the Galois field equation based on the Vieta's formulas includes:
determining a first exponent corresponding to a first coefficient of the Galois field equation based on a generator of the Galois field equation, where the first coefficient is a coefficient of a term with a highest exponent;
determining a second exponent corresponding to a first root of the Galois field equation and a third exponent corresponding to a second root of the Galois field equation, based on the generator;
determining a product relational expression of the second exponent and the third exponent based on the Vieta's formulas, where the product relational expression includes the first exponent; and
determining the target relational expression based on the product relational expression, where the first root and the first error location have a reciprocal relation with each other, and the second root and the second error location have a reciprocal relation with each other.

In an embodiment, the determining the target relational expression based on the product relational expression includes:
performing a logarithmic operation on both sides of the product relational expression to obtain a summation relational expression; and
determining the target relational expression based on the summation relational expression, the reciprocal relation between the first root and the first error location, and the reciprocal relation between the second root and the second error location.

In an embodiment, the determining the first traversal range based on the target relational expression and the predetermined number of digits includes:
determining a midpoint based on the target relational expression;
determining an initial traversal range based on the midpoint and a value range of the Galois field equation; and
determining the first traversal range based on the initial traversal range and the predetermined number of digits.

In a second aspect, an apparatus for decoding an error correction code is provided according to the present disclosure, which includes:
an acquiring unit, configured to acquire a Galois field equation corresponding to the error correction code, where a total length of the error correction code is a predetermined number of digits;
a first determining unit, configured to determine a target relational expression corresponding to a plurality of error locations after decoding the error correction code based on the Galois field equation, wherein the target relational expression is derived based on the Vieta's formulas;
a second determining unit, configured to determine a first traversal range based on the target relational expression and the predetermined number of digits;
a third determining unit, configured to determine a first error location from values in the first traversal range; and a fourth determining unit, configured to determine a second error location based on the target relational expression and the first error location.

In an embodiment, the first determining unit is further configured to:
determine a first exponent corresponding to a first coefficient of the Galois field equation based on a generator of the Galois field equation;
determine a second exponent corresponding to a first root of the Galois field equation and a third exponent corresponding to a second root of the Galois field equation, based on the generator;
determine a product relational expression of the second exponent and the third exponent based on the Vieta's formulas, where the product relational expression includes the first exponent; and
determine the target relational expression based on the product relational expression, where the first root and the first error location have a reciprocal relation with each other, and the second root and the second error location have a reciprocal relation with each other.

In an embodiment, the first determining unit is further configured to:
perform a logarithmic operation on both sides of the product relational expression to obtain a summation relational expression; and
determine the target relational expression based on the summation relational expression, the reciprocal relation between the first root and the first error location, and the reciprocal relation between the second root and the second error location.

In an embodiment, the second determining unit is further configured to:
determine a midpoint based on the target relational expression;
determine an initial traversal range based on the midpoint and a value range of the Galois field equation; and
determine the first traversal range based on the initial traversal range and the predetermined number of digits.

In a third aspect, a device for decoding an error correction code is provided according to the present disclosure, which includes a memory and a processor. The memory is configured to store a program. The processor is configured to execute the program to perform the method for decoding an error correction code according to any one of the embodiments in the first aspect described above.

In a fourth aspect, a computer-readable storage medium is provided according to the present disclosure. The computer-readable storage medium stores a computer program, where the computer program, when being executed by a processor, causes the processor to perform the method for decoding an error correction code according to any one of the embodiments in the first aspect described above.

It can be seen that the present disclosure has the following beneficial effects.

In the embodiments of the present disclosure, in decoding the error correction code, the Galois field equation corresponding to the error correction code is acquired, where the total length of the error correction code is the predetermined number of digits. The target relational expression corresponding to multiple error locations after decoding the error correction code is derived based on the Galois field equation and the Vieta's formulas. The first traversal range is determined based on the target relational expression and the predetermined number of digits of the error correction code, and then the first error location is determined from values included in the first traversal range. Finally, the second error location is determined based on the target relational expression and the first error location. With the method for decoding an error correction code according to the embodiments of the present disclosure, the traversal range for determining the error location is reduced based on the Galois field equation and the Vieta's formulas. Therefore, it needs not to traverse all values in the Galois field, thereby reducing the calculation amount and the complexity in the decoding process.

BRIEF DESCRIPTION OF THE DRAWINGS

In order to more clearly illustrate technical solutions in embodiments of the present disclosure, the drawings to be used in the description of the embodiments are briefly described below. Apparently, the drawings in the following description show only some embodiments of the present disclosure, and other drawings may be obtained by those skilled in the art from the drawings.

DETAILED DESCRIPTION

Figure 1:
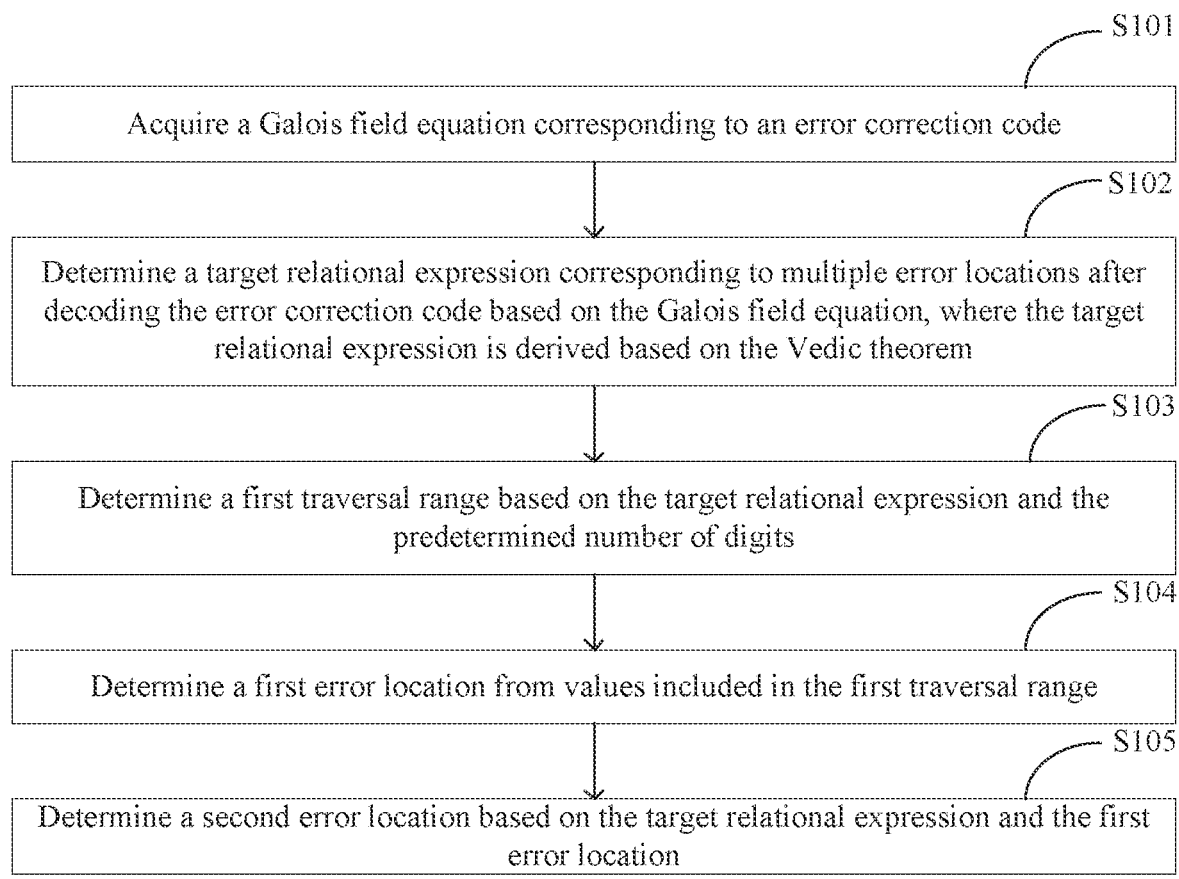
FIG. 1 is a flow chart of a method for decoding an error correction code according to an embodiment of the present disclosure.

Technical solutions in the embodiments of the present disclosure are clearly and completely described below in conjunction with the drawings of the embodiments of the present disclosure. The described embodiments are only exemplary implementations of the present disclosure, rather than all implementations. Based on the embodiments in the present disclosure, those skilled in the art may obtain other embodiments without any creative efforts, and these embodiments also fall within the protection scope of the present disclosure.

In order to facilitate the understanding of the technical solutions according to the embodiments of the present disclosure, the technical background of the embodiments of the present disclosure is described below.

A field is an algebraic system in which two mathematical operations for elements in the field are defined. The field includes an addition set for all the elements and a product set for non-zero elements. The field is closure in addition and product, that is, any result obtained by performing addition or product on the elements in the field is still an element in the field. The product and the addition in the field may be respectively defined as AND operation (module-2 addition) and exclusive OR operation in C language, but are usually represented by a symbol "+" and a symbol "*".

Assuming that a field $G=\{0,1,2,3, \ldots p-1\}$ includes a set of integers, where p represents a prime number, two mathematical operations are defined as modulo-p addition and module-p product in the field. In order to achieve the closure property in product, p must be a prime number, and the number of elements in the set is p. Based on this, for a set of polynomials, if coefficients in the polynomials are limited to the elements in the finite field GF(p), and addition, subtraction, product and division in the polynomials are redefined based on operational rules in the finite field, then the set of polynomials is referred to as a polynomial over the finite field. If GF(p) is extended to $GF(2^p)$, p is not 0 limited to prime numbers, but $GF(2^p)$ still conforms to the operational rules of the addition and product in the finite field. In other words, numerical elements in the finite field are mapped to polynomial elements, that is, the elements in the finite field are $2^p$ Polynomials Including 0 and 1. The Finite Field $GF(2^p)$ is also Referred to as a Galois field.

A BCH code is a cyclic code in a Galois field, having a characteristic of on-demand design, that is, a BCH code for an application scenario is designed based on the number of errors to be corrected in the application scenario. That is, error locations are obtained by decoding the BCH code. The decoding mainly includes: obtaining an adjoint polynomial from a received polynomial, determining coefficients of an error location polynomial based on coefficients of the adjoint polynomial, and determining an error location by solving a root of the error location polynomial. A reciprocal of the root is the determined error location.

A BCH error correction code with an error-correcting capability of 2 is mainly used for error correction in a scenario of flash storage, that is, the BCH code is decoded to obtain information about two error locations in the flash storage. The critical step of the decoding is the calculation of a root of an error location polynomial corresponding to the BCH code. Since the error-correcting capability is 2, the root to be calculated is the root of a quadratic equation with one variable in the Galois field. The elements in the Galois field are essentially polynomials. Therefore, in the conventional technology, the root of the equation is solved by traversing all values in the Galois field to substitute each of the values into the quadratic equation with one variable and determine whether the equation is equal to zero, which results in a large calculation amount for solving the roots and thus results in a complex decoding process.

Based on this, a method for decoding an error correction code is provided according to an embodiment of the present disclosure, to reduce the calculation amount and the complexity of the decoding process. In an embodiment, a Galois field equation corresponding to an error correction code is acquired, where a total length of the error correction code is a predetermined number of digits. Then a target relational expression involving multiple error locations of a code acquired by decoding the error correction code is determined from the Galois field equation based on the Vieta's formulas. Then a first traversal range is determined based on the target relational expression and the predetermined number of digits of the error correction code, and a first error location is determined from values included in the first traversal range. Finally, a second error location is determined based on the target relational expression and the first error location. With the method for decoding an error correction code according to the embodiment of the present disclosure, the traversal range for determining the error location is reduced based on the Galois field equation and the Vieta's formulas. Therefore, it needs not to traverse all values in the Galois field, thereby reducing the calculation amount and the complexity in the decoding process. Hereinafter, the method for decoding an error correction code according to the embodiment of the present disclosure is described in conjunction with the drawings.

Reference is made to FIG. 1, which is a flow chart of a method for decoding an error correction code according to an embodiment of the present disclosure.

The method includes the following steps S101 to S105.

In step S101, a Galois field equation corresponding to the error correction code is acquired.

In decoding the error correction code, a Galois field equation corresponding to an error location may be determined based on a principle of decoding an error correction code, i.e., the error location polynomial described above. The decoding mainly includes: obtaining an adjoint polynomial from a received polynomial, determining coefficients of an error location polynomial based on coefficients of the adjoint polynomial, and determining an error location by solving a root of the error location polynomial. This process is similar to the process of decoding an error correction code in the conventional technology, which is not described in detail herein.

In the embodiment of the present disclosure, the root of the Galois field equation is solved mainly based on the error correction code with the error-correcting capability of 2, that is, the Galois field equation is a quadratic equation with one variable. For example, the error correction code may be a BCH code. A total length of the error correction code may be preset according to actual requirements, that is, the total length of the error correction code is a predetermined number of digits.

In step S102, a target relational expression corresponding to multiple error locations after decoding the error correction code is derived based on the Galois field equation and the Vieta's formulas.

In a case that the error-correcting capability is 2, the Galois field equation is a quadratic equation with one variable and has two different roots, which conforms to the Vieta's formulas. Since reciprocals of the roots of the Galois field equation are the to-be-determined error locations, the target relational expression corresponding to the two error locations can be derived based on the Vieta's formulas.

The Galois field has a generator, where each of non-zero elements in the Galois field can be expressed by the generator raised to a power, that is, an exponential form of the generator. In a specific implementation, a first exponent corresponding to a first coefficient of the Galois field equation may be determined based on the generator of the Galois field equation. That is, the first coefficient of the Galois field equation is expressed in the exponential form of the generator. A second exponent corresponding to a first root of the Galois field equation and a third exponent corresponding to a second root of the Galois field equation are determined based on the generator. That is, the two roots of the Galois field equation are expressed in exponential forms of the generator, where the powers given to the generator to express the roots may be expressed by a variable. A product relational expression of the second exponent and the third exponent is determined based on the Vieta's formulas. That is, the product relational expression of the two roots of the Galois field equation may be determined based on the Vieta's formulas. Since the two roots are expressed in the exponential form of the generator, the product relational expression of the second exponent and the third exponent can be determined. According to the Vieta's formulas, a product of two roots of an equation can be expressed by a coefficient of a term with a highest exponent and a coefficient of a constant term, that is, the product can be expressed by the first coefficient and the coefficient of the constant term. Therefore, the product relational expression includes the first exponent corresponding to the first coefficient. According to the above embodiment, since the reciprocals of the roots of the Galois field equation are the error locations, the target relational expression involving the two error locations can be determined based on the product relational expression of the two roots.

In an embodiment, after the product relational expression of the second exponent and the third exponent is determined, a logarithmic operation is performed on both sides of the product relational expression to obtain a summation relational expression. The target relational expression involving the first error location and the second error location is determined based on the summation relational expression, the reciprocal relation between the first root and the first error location, and the reciprocal relation between the second root and the second error location. Hereinafter, the principle of deriving the target relational expression based on Vieta's formulas is described in conjunction with an application scenario.

In the application scenario, the Galois field equation is expressed as $u_1 x^2 + u_2 x + 1 = 0$ ($GF(2^n)$), where the first coefficient is expressed as $u_1$. In the Galois field, the generator is expressed as a, the first coefficient $u_1$ is expressed as a first exponent of the generator a, that is, $u_1 = a^{r_1}$. Two roots of the Galois field equation are expressed as a first root $x_1$ and a second root $x_2$, which are represented by a second exponent and a third exponent of the generator a, that is, $x_1 = a^{r_2}$ and $x_2 = a^{r_3}$. Based on the Vieta's formulas, a product relational expression of the first root and the second root may be expressed as $x_1 * x_2 = u_1^{-1}$, which is converted to be $a^{r_2+r_3} = a^{-r_1}$ by using the generator a. A logarithmic operation is performed on both sides of the product relational expression to obtain a summation relational expression $r_1 + r_2 + r_3 = 0 \mod(2^n - 1)$. Since the first error location $e_1$ is the reciprocal of the first root and the second error location $e_2$ is the reciprocal of the second root, the target relational expression involving the first error location $e_1$ and the second error location $e_2$ can be derived as $e_1 + e_2 = r_3 \mod(2^n - 1)$ from the summation relational expression.

In step S103, a first traversal range is determined based on the target relational expression and the predetermined number of digits.

After the target relational expression involving the first error location and the second error location is determined, the first traversal range for solving the root is determined based on the target relational expression and a total length of the error correction code (i.e., the predetermined number of digits).

In a specific implementation process, the target relational expression includes an addition of two error locations, which can be used to determine a midpoint. Then an initial traversal range is determined based on the midpoint and a length of a value range of the Galois field equation, that is, $2^n$. For example, the midpoint is determined as a starting position, a range having a fixed length from the midpoint to the left or right is determined as the initial traversal range. For example, the fixed length is a half of the length of the value range of the Galois field equation. The length of the error correction code is the predetermined number of digits. Therefore, in a case that the initial traversal range is greater than the length of the error correction code, the first traversal range is determined based on the initial traversal range and the predetermined number of digits of the error correction code, avoiding unnecessary calculation caused by solving the roots of the equation in an invalid range.

In step S104, a first error location is determined from values included in the first traversal range.

The values in the first traversal range are traversed, that is, each of the values is substituted into the Galois field equation, and a value making the Galois field equation equal to zero is determined as the first error location.

In step S105, a second error location is determined based on the target relational expression and the first error location.

According to the above embodiment, the target relational expression indicates a relationship between the first error location and the second error location. After the first error location is determined, the second error location can be determined based on the target relational expression and the first error location. For example, a sum of the first error location and the second error location is determined based on the target relational expression, so that after the first error location is determined, the second error location can be determined based on the sum of the first error location and the second error location and the length of the value range of the Galois field equation.

In order to facilitate understanding of the method for decoding an error correction code according to the embodiment of the present disclosure, the method is described in conjunction with an application scenario below.

In an application scenario, a total length of the BCH code may be set to 255 digits, and a finite field corresponding to the BCH code is $GF(2^8)$. That is, the value range of the Galois field equation is [0,254], and the error-correcting capability is 2. The Galois field equation used for decoding is expressed as $a^{56} x^2 + a^{65} x + 1 = 0$ ($GF(2^8)$), where "a" represents the generator of the Galois field. It can be seen from the above target relational expression derived based on the Vieta's formulas that the target relational expression corresponding to the first error location $e_1$ and the second error location $e_2$ is expressed as $e_1 + e_2 = 56 \mod 255$, and then the midpoint can be determined as $56/2 = 28$. Values are traversed in a range having a length being a half of the length of the value range of the Galois field equation, i.e., a range from the midpoint to the highest position (the right) or from the midpoint to the lowest position (the left). In the embodiment, for example, the range with the half of the length from the midpoint to the higher position is determined as the initial traversal range, that is, [27,155]. In the application scenario, the total length of the error correction code is the same as the length of the value range of the finite field, so that the first traversal range is [27,155]. Therefore, a second traversal range for determining the second error location can be acquired as [156,254]. In determining the first error location $e_1$, all values in the range [27,155] is traversed to be substituted into the Galois field equation, and a value making the equation equal to zero is determined as the first error location. Assuming that in the application scenario, the first error location $e_1$ is determined as 142, the second error location is calculated by the following equation $e_2 = 56 - 142 = -86 \mod 255 = 169 \mod 255$ based on the target relational expression $e_1 + e_2 = 56 \mod 255$ and first error location $e_1$, that is, the second error location is determined as 169.

In another application scenario, the total length of the BCH code may be set to 144 digits, the finite field corresponding to the BCH code is $GF(2^8)$, and the error-correcting capability is 2. The Galois field equation used for decoding is expressed as $a^{67} x^2 + a^{236} x + 1 = 0$ ($GF(2^8)$), where the value range of the Galois field equation is [0,254], and "a" represents the generator of the Galois field. It can be seen, from the above target relational expression derived based on the Vieta's formulas, that the target relational expression corresponding to the first error location $e_1$ and the second error location $e_2$ is expressed as $e_1 + e_2 = 67 \mod 255$, and then the midpoint location can be determined as $67/2 = 33.5$. In a case that the calculated midpoint is a decimal number, a nearest integer to the decimal number, that is, 33 or 34, is determined as the midpoint. Optionally, values are traversed in a range having a length being a half of the length of the value range of the Galois field equation, i.e., the range from the midpoint location to the highest position, which is determined as the initial traversal range, i.e., [34, 160]. Since the total length of the error correction code is preset to 144 digits, the possible traversal range is [34, 143], which is determined as the first traversal range. Since the value range of the Galois field equation is [0, 254], the remaining traversal ranges are [0, 33] and [161, 254]. Since the total length of the error correction code is 144 digits, the possible second traversal range is [0, 33]. All values in the first traversal range [34,143] are traversed to be substituted into the Galois field equation, to determine the first error location $e_1$. Assuming that the first error location in the first traversal range is determined as 63, the second error location $e_2$ is calculated by using the equation $e_2=67-63=4$ mod 255 based on the target relational expression $e_1+e_2=67$ mod 255 and the first error location $e_1$, that is, the second error location $e_2$ is determined as 4.

With the method for decoding an error correction code according to the embodiment of the present disclosure, the traversal range for determining the error locations is reduced based on the Galois field equation and the Vieta's formulas, so that it is unnecessary to traverse all values, thereby reducing the calculation amount and the complexity of the decoding process.

Figure 2:
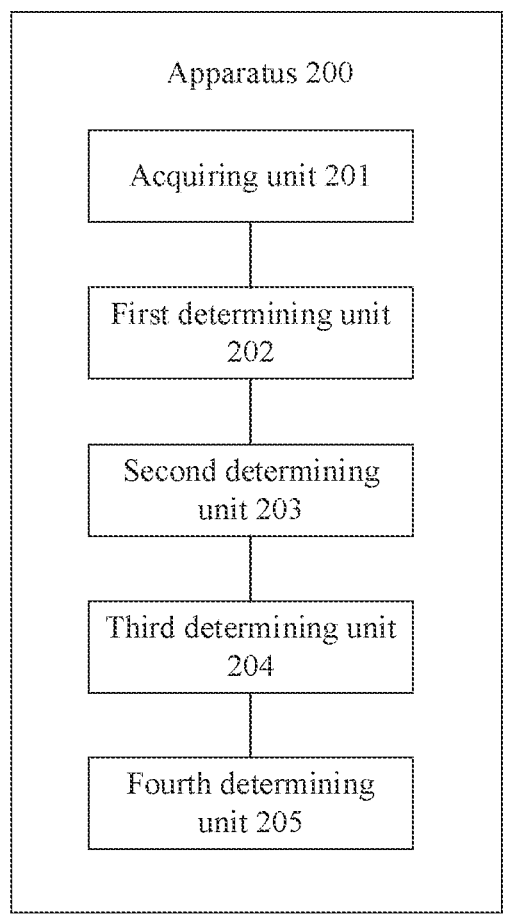
FIG. 2 is a schematic diagram of an apparatus for decoding an error correction code according to an embodiment of the present disclosure.

Based on the embodiments of the method described above, an apparatus for decoding an error correction code is further provided according to an embodiment of the present disclosure. Reference is made to FIG. 2, which is a schematic diagram of an apparatus for decoding an error correction code according to an embodiment of the present disclosure.

The apparatus 200 may include an acquiring unit 201, a first determining unit 202, a second determining unit 203, a third determining unit 204 and a fourth determining unit 205.

The acquiring unit 201 is configured to acquire a Galois field equation corresponding to the error correction code, where a total length of the error correction code is a predetermined number of digits.

The first determining unit 202 is configured to determine a target relational expression corresponding to multiple error locations after decoding the error correction code based on the Galois field equation, where the target relational expression is derived based on the Vieta's formulas.

The second determining unit 203 is configured to determine a first traversal range based on the target relational expression and the predetermined number of digits.

The third determining unit 204 is configured to determine a first error location from values in the first traversal range.

The fourth determining unit 205 is configured to determine a second error location based on the target relational expression and the first error location.

In an embodiment, the first determining unit 202 is further configured to: determine a first exponent corresponding to a first coefficient of the Galois field equation based on a generator of the Galois field equation, where the first coefficient is a coefficient of a term with a highest exponent; determine a second exponent corresponding to a first root of the Galois field equation and a third exponent corresponding to a second root of the Galois field equation, based on the generator; determine a product relational expression of the second exponent and the third exponent based on the Vieta's formulas, where the product relational expression includes the first exponent; and determine the target relational expression based on the product relational expression, where the first root and the first error location have a reciprocal relation with each other, and the second root and the second error location have a reciprocal relation with each other.

In an embodiment, the first determining unit 202 is further configured to: perform a logarithmic operation on both sides of the product relational expression to obtain a summation relational expression; and determine the target relational expression based on the summation relational expression, the reciprocal relation between the first root and the first error location, and the reciprocal relation between the second root and the second error location.

In an embodiment, the second determining unit 203 is further configured to: determine a midpoint based on the target relational expression; determine an initial traversal range based on the midpoint and a length of a value range of the Galois field equation; and determine the first traversal range based on the initial traversal range and the predetermined number of digits.

The apparatus for decoding an error correction code according to the embodiments of the present disclosure has similar beneficial effects to those of the method embodiments, which are not repeated herein.

Figure 3:
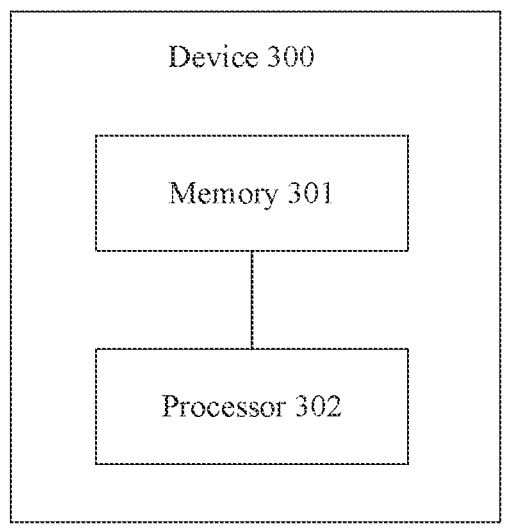
FIG. 3 is a schematic diagram of a device for decoding an error correction code according to an embodiment of the present disclosure.

Based on the embodiments of the method and the embodiments of the apparatus described above, a device for decoding an error correction code is further provided according to an embodiment of the present disclosure. Reference is made to FIG. 3, which is a schematic diagram of a device for decoding an error correction code according to an embodiment of the present disclosure.

The device 300 includes a memory 301 and a processor 302.

The memory 301 is configured to store a program.

The processor 302 is configured to execute the program to perform the method for decoding an error correction code according to the embodiment of the method described above.

Further, a computer-readable storage medium is further provided according to an embodiment of the present disclosure. The computer-readable storage medium stores a computer program, where the computer program, when being executed by a processor, causes the processor to perform the method for decoding an error correction code according to the embodiment of the method described above.

It should be noted that the embodiments in this specification are described in a progressive way, each of which emphasizes the differences from others, and the same or similar parts among the embodiments may be referred to each other. In particular, since the embodiments of the system or the apparatus are basically similar to the embodiments of the method, the description of the embodiments of the system or the apparatus is relatively simple, and reference may be made to the relevant part of the embodiments of the method. The embodiments of the apparatus described above are only illustrative, units or modules described as separate components may be or may not be physically separated, the components shown as units or modules may be or may not be physical modules, that is, the components may be arranged in one location or distributed onto multiple network units. Some or all of the units or modules may be selected based on actual needs to achieve the objectives of the solutions of the embodiments. Those skilled in the art can understand and implement such embodiments of the present disclosure without any creative work.

It should be understood that in this present disclosure, the term "at least one" refers to one or more, and the term "multiple" refers to two or more. The term "and/or" is used to describe an association relationship of associated objects, and indicates three possible relationships. For example, "A and/or B" may indicate a case that there is only A, a case that there is only B, and a case that there are both A and B, where A and B may be singular or plural. The symbol "/" generally indicates that a former object and a latter object are associated by an "or" relationship. The term "at least one of" or a similar expression refers to "any combination of", including any combination of a single item or multiple items. For example, at least one of a, b or c may indicate: a, b, c, "a and b", "a and c", "b and c", or, "a and b and c", where a, b and c may be singular or plural.

It should be further noted that the relationship terminologies such as "first" and "second" are only used herein to distinguish one entity or operation from another entity or operation, rather than to necessitate or imply that the actual relationship or order exists between the entities or operations. Moreover, terms of "include", "comprise" or any other variants thereof are intended to be non-exclusive. Therefore, a process, method, article or device including a series of elements includes not only the elements but also other elements that are not explicitly listed, or also includes the elements inherent for the process, method, article or device. Unless expressively limited otherwise, the statement "comprising (including) one . . . " does not exclude the case that other similar elements may exist in the process, method, article or device.

The steps of the method or algorithm described in conjunction with the embodiments of the present disclosure may be directly implemented by hardware, a software module executed by a processor, or a combination thereof. The software module may be stored in a random-access memory (ROM), a memory, a read-only memory (ROM), an electrically programmable ROM, an electrically erasable programmable ROM, a register, a hard disk, a removable magnetic disk, a CD-ROM, or any other forms of storage medium well known in the art.

Based on the above description of the disclosed embodiments, those skilled in the art can implement or carry out the present disclosure. It is apparent for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A method for decoding an error correction code by a decoding device comprising a processor, comprising:
   acquiring, by the processor, a Galois field equation corresponding to the error correction code, wherein a total length of the error correction code is a predetermined number of digits;
   determining, by the processor, a target relational expression corresponding to a plurality of error locations after decoding the error correction code based on the Galois field equation, wherein the target relational expression is derived based on Vieta's formulas;
   determining, by the processor, a first traversal range based on the target relational expression and the predetermined number of digits;
   determining, by the processor, a first error location from values comprised in the first traversal range;
   determining, by the processor, a second error location based on the target relational expression and the first error location; and
   decoding, by the processor, the error correction code based on the first error location and the second error location.

2. The method according to claim 1, wherein a process of deriving the target relational expression based on the Vieta's formulas comprises:
   determining, by the processor, a first exponent corresponding to a first coefficient of the Galois field equation based on a generator of the Galois field equation, wherein the first coefficient is a coefficient of a term with a highest exponent;
   determining, by the processor, a second exponent corresponding to a first root of the Galois field equation and a third exponent corresponding to a second root of the Galois field equation, based on the generator;
   determining, by the processor, a product relational expression of the second exponent and the third exponent based on the Vieta's formulas, wherein the product relational expression comprises the first exponent; and
   determining, by the processor, the target relational expression based on the product relational expression, wherein the first root and the first error location have a reciprocal relation with each other, and the second root and the second error location have a reciprocal relation with each other.

3. The method according to claim 2, wherein the determining, by the processor, the target relational expression based on the product relational expression comprises:
   performing, by the processor, a logarithmic operation on both sides of the product relational expression to obtain a summation relational expression; and
   determining, by the processor, the target relational expression based on the summation relational expression, the reciprocal relation between the first root and the first error location, and the reciprocal relation between the second root and the second error location.

4. The method according to claim 1, wherein the determining, by the processor, the first traversal range based on the target relational expression and the predetermined number of digits comprises:
   determining, by the processor, a midpoint based on the target relational expression;
   determining, by the processor, an initial traversal range based on the midpoint and a value range of the Galois field equation; and
   determining, by the processor, the first traversal range based on the initial traversal range and the predetermined number of digits.

5. A device for decoding an error correction code, comprising a memory and a processor, wherein
   the memory is configured to store a program; and
   the processor is configured to execute the program to perform operations of:
   acquiring a Galois field equation corresponding to the error correction code, wherein a total length of the error correction code is a predetermined number of digits;
   determining a target relational expression corresponding to a plurality of error locations after decoding the error correction code based on the Galois field equation, wherein the target relational expression is derived based on the Vieta's formulas;
   determining a first traversal range based on the target relational expression and the predetermined number of digits;
   determining a first error location from values comprised in the first traversal range; and
   determining a second error location based on the target relational expression and the first error location.

6. The device according to claim 5, wherein the processor is configured to execute the program to perform operations of:
   determining a first exponent corresponding to a first coefficient of the Galois field equation based on a generator of the Galois field equation, wherein the first coefficient is a coefficient of a term with a highest exponent;

determining a second exponent corresponding to a first root of the Galois field equation and a third exponent corresponding to a second root of the Galois field equation, based on the generator;

determining a product relational expression of the second exponent and the third exponent based on the Vieta's formulas, wherein the product relational expression comprises the first exponent; and determining the target relational expression based on the product relational expression, wherein the first root and the first error location have a reciprocal relation with each other, and the second root and the second error location have a reciprocal relation with each other.

7. The device according to claim 6, wherein the processor is configured to execute the program to perform operations of:

performing a logarithmic operation on both sides of the product relational expression to obtain a summation relational expression; and determining the target relational expression based on the summation relational expression, the reciprocal relation between the first root and the first error location, and the reciprocal relation between the second root and the second error location.

8. The device according to claim 5, wherein the processor is configured to execute the program to perform operations of:

determining a midpoint based on the target relational expression;

determining an initial traversal range based on the midpoint and a value range of the Galois field equation; and determining the first traversal range based on the initial traversal range and the predetermined number of digits.

9. The device according to claim 5, wherein the processor is configured to execute the program to perform operation of decoding the error correction code based on the first error location and the second error location.

10. A non-transitory computer-readable storage medium, storing a computer program, wherein the computer program, when being executed by the processor, causes the processor to;

acquire a Galois field equation corresponding to the error correction code, wherein a total length of the error correction code is a predetermined number of digits;

determine a target relational expression corresponding to a plurality of error locations after decoding the error correction code based on the Galois field equation, wherein the target relational expression is derived based on Vieta's formulas;

determine a first traversal range based on the target relational expression and the predetermined number of digits;

determine a first error location from values comprised in the first traversal range;

determine a second error location based on the target relational expression and the first error location; and decode the error correction code based on the first error location and the second error location.

* * * * *